US012393355B2

(12) United States Patent
Prather

(10) Patent No.: US 12,393,355 B2
(45) Date of Patent: Aug. 19, 2025

(54) COMBINED MEMORY MODULE LOGIC DEVICES FOR REDUCED COST AND IMPROVED FUNCTIONALITY

(71) Applicant: Micron Technology, Inc., Boise, ID (US)

(72) Inventor: Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 18/223,249

(22) Filed: Jul. 18, 2023

(65) Prior Publication Data
US 2024/0069762 A1 Feb. 29, 2024

Related U.S. Application Data

(60) Provisional application No. 63/402,432, filed on Aug. 30, 2022.

(51) Int. Cl.
*G06F 3/06* (2006.01)

(52) U.S. Cl.
CPC .......... *G06F 3/0625* (2013.01); *G06F 3/0659* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 6,502,161 B1* | 12/2002 | Perego | G11C 5/04 711/5 |
| 9,798,370 B2* | 10/2017 | Pamley | G06F 1/3203 |
| 9,891,855 B2* | 2/2018 | Yang | G06F 3/0614 |
| 10,394,460 B1* | 8/2019 | Patel | G06F 3/0611 |
| 11,295,803 B2* | 4/2022 | Suh | G11C 11/409 |
| 2003/0206046 A1* | 11/2003 | To | H03K 19/00384 327/333 |
| 2004/0028164 A1* | 2/2004 | Jiang | H04L 12/46 375/371 |
| 2008/0052462 A1* | 2/2008 | Blakely | G06F 13/1673 711/115 |
| 2009/0175090 A1* | 7/2009 | Smolka | G11C 7/106 365/189.05 |
| 2010/0138684 A1* | 6/2010 | Kim | G06F 1/3225 713/600 |
| 2012/0233395 A1* | 9/2012 | Smith | G06F 13/4239 711/E12.001 |
| 2013/0301207 A1* | 11/2013 | Chun | H05K 1/117 174/267 |
| 2014/0223120 A1* | 8/2014 | Franceschini | G06F 21/62 711/162 |
| 2017/0168532 A1* | 6/2017 | Kim | G06F 1/206 |
| 2020/0019312 A1* | 1/2020 | Kinsley | G11C 5/14 |

(Continued)

*Primary Examiner* — Yaima Rigol
(74) *Attorney, Agent, or Firm* — Dorsey & Whitney LLP

(57) ABSTRACT

An apparatus, comprising a plurality of memories and a single integrated circuit (IC) that is configured to be coupled to a host device by a host bus and that is coupled to the plurality of memories by a memory bus, wherein the IC comprises a logic buffer module that is configured to buffer data signals, command signals, address signals, and clock signals between the host device and the plurality of memories, and a power management integrated circuit (PMIC) module that is configured to regulate voltage and monitor current provided to the plurality of memories.

20 Claims, 5 Drawing Sheets

(56) References Cited

U.S. PATENT DOCUMENTS

| | | | |
|---|---|---|---|
| 2021/0271412 A1* | 9/2021 | Cheong | G06F 1/3275 |
| 2023/0205428 A1* | 6/2023 | Kim | G06F 3/0653 |
| | | | 711/105 |
| 2023/0402123 A1* | 12/2023 | Park | G11C 29/36 |
| 2024/0053809 A1* | 2/2024 | Kim | G06F 1/3296 |

* cited by examiner

COMBINED MEMORY MODULE LOGIC DEVICES FOR REDUCED COST AND IMPROVED FUNCTIONALITY

CROSS-REFERENCE TO RELATED APPLICATION(S)

The present application claims priority to U.S. Provisional Patent Application No. 63/402,432, filed Aug. 30, 2022, the disclosure of which is incorporated herein by reference in its entirety.

TECHNICAL FIELD

The present disclosure generally relates to memory devices, and more particularly relates to memory devices with combined logic modules for reduced cost and improved functionality.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

Figure 1:
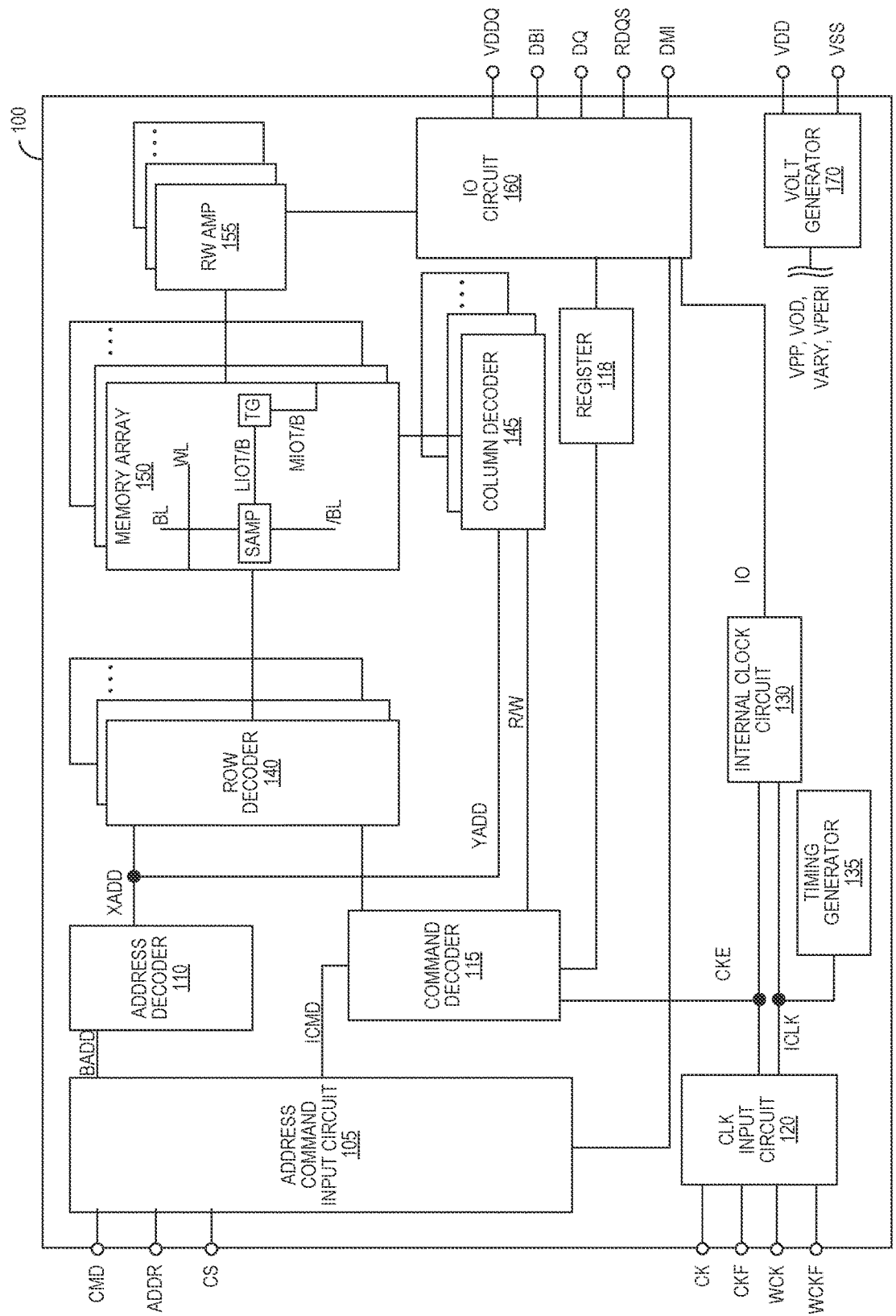
FIG. 1 is a simplified block diagram schematically illustrating a memory device of the memory module in accordance with the embodiment of the present technology.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

Memory modules such as dual in-line memory modules (DIMM) include one or more buffers or registers between a host device and the memory device. Buffered memory modules can have improved system integration and system stability as the density of memory devices in the memory module increases while reducing electrical load on the host device. The memory buffer may be configured to transmit command signals, address signals, clock signals, data signals, power signals, or any combination thereof. For example, a load reduced DIMM (LRDIMM) has memory buffers that buffer all command, address, and clock lines to achieve a large overall maximum memory capacities, while keep the transmitting signal in parallel.

Traditional memory buffers are integrated with the memory device on the same chip as the memory array and are configured to maintain a 1:1 ratio in data speed between the host device and the memory module. That is, the host device and the memory module typically operate at a same clock frequency. Since the host device generally operates at a higher speed compared to the memory module, the on-chip memory buffer architecture limits overall system performance and challenges the system integration. In addition, a high-capacity DIMM may have a large number of memory devices, each of which receives memory address signals on the command/address bus, and their combined input buffer capacitance limits the memory module operation speed. Further, advanced memory design requires for higher memory system bandwidth and improved power efficiency while including more densified memory cells for scalability. Therefore, using a higher supply voltage to enable higher data transition rate in and out of the memory will not be a proper approach due to the increased power consumption.

The memory system integration challenge and native clocking challenges of traditional memory modules require new topologies of memory architectures in achieving higher memory system bandwidth and power efficiency. The present disclosure addresses these concerns and others by providing an approach that combines memory buffer and logic functions into a single memory buffer device which is coupled to a plurality of memory devices on a memory module. In particular, the memory buffer device integrates logic buffer module(s), power management integrated circuit(s) (PMIC), and/or any other logic modules into a single semiconductor die. Moreover, migrating logic buffer and other control logic out from the memory devices provides additional silicon area on the memory devices for higher memory capacity. Further, the memory architecture presented in the present disclosure leads to a more efficient operation of the PMIC, therefore allowing a reduced memory device operating voltages and intelligent scaled output phases based on a projected memory power needs.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DO, ROOS, DBI, and DMI, power supply terminals VDD, VSS, VDDO, and VSSO, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADO) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DO, ROOS, DBI, and DMI via read/write amplifiers 155 and the input/output circuit 160 according to the ROOS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DO, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary.

Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (I/O) clock signals. The I/O clock signals can be supplied to the input/output circuit 160 and can be used as a timing signal for determining an output timing of read data and the input timing of write data. The I/O clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Figure 2:
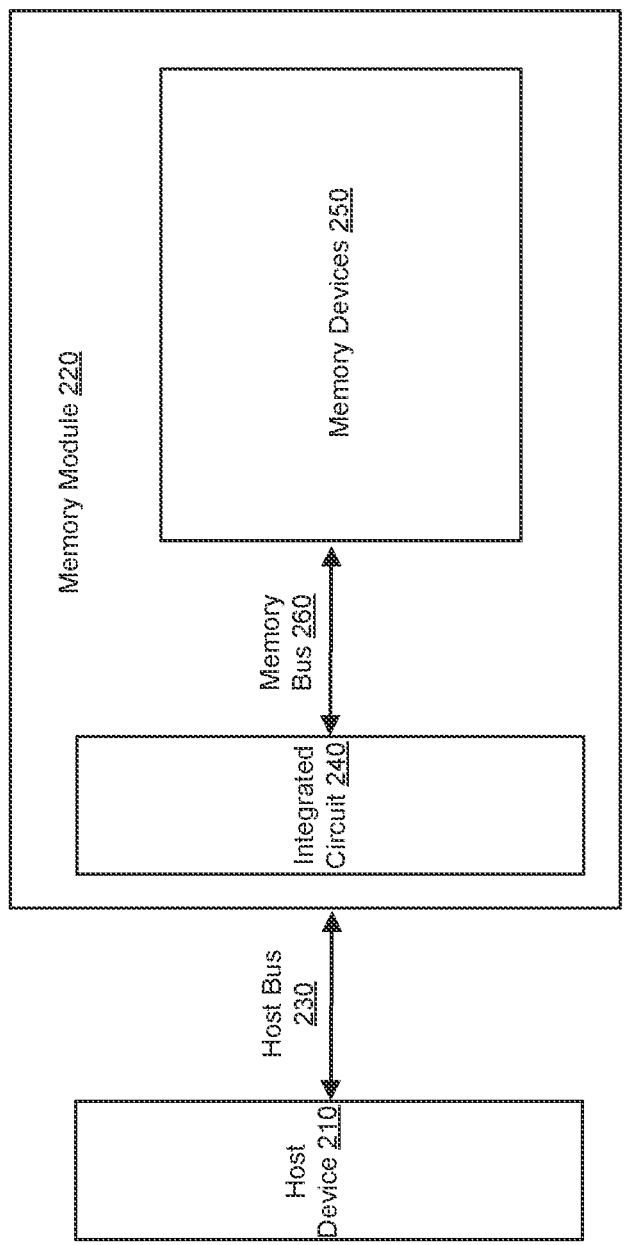
FIG. 2 is a simplified block diagram schematically illustrating a memory module in accordance with an embodiment of the present technology.

Turning to FIG. 2, a memory module 220 is illustrated in accordance with one embodiment of the present technology. The memory module 220 is coupled with a host device 210 through a host bus 230. Particularly, the memory module 220 includes a plurality of memory devices 250 and a memory buffer integrated circuit (IC) 240, the memory devices 250 and the memory buffer IC 240 being operably coupled by a memory bus 260.

In an exemplary embodiment, the memory buffer IC 240 includes memory buffers that receive signals including command, address, power, or clock signals from the host device 210 through the host bus 230. The memory buffer IC 240 then distributes and/or re-transmits the received signals to the plurality of memory devices 250 over the memory bus 260. In one embodiment, the memory buffer IC 240 permits configurability of memory bus width and clock speed. For example, the memory buffer IC 240 can be configured to provide a wider memory bus width and a slower clock speed between the host device 210 and the plurality of memory devices 250. In another example, the memory buffer IC 240 can be configured to provide a narrower memory bus width and a faster clock speed between the host device 210 and the plurality of memory devices 250.

In another exemplary embodiment, the host device 210 transmits command/address signals to, and receives data signals from, the memory module 220 during memory access operations (e.g., reads and writes). The host device 210 can be any one of a number of electronic devices capable of utilizing memory for the temporary or persistent storage of information, or a component thereof. For example, the host device 210 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 210 may be a networking device (e.g., a switch, a router, etc.) or a recorder of digital images, audio and/or video, a vehicle, an appliance, a toy, or any one of a number of other products. In one embodiment, the host device 210 may be indirectly connected to the memory module 220 (e.g., over a networked connection or through intermediary devices).

In another exemplary embodiment, the plurality of memory devices 250 each include one or more memory arrays that are operably coupled to the memory buffer IC 240. For example, the memory devices 250 can each include an array of memory cells, including volatile (e.g., DRAM, SRAM, floating body RAM, etc.) and/or non-volatile (NAND, NOR, 3D XPoint™, PCM, MRAM, FeRAM, etc.) cells. In one embodiment, the memory devices 250 and the memory buffer IC 240 can be fabricated on separated semiconductor dice and packaged in a same assembly. In another embodiment, the memory devices 250 and the memory buffer IC 240 can be packaged in separate assemblies and interconnected on a same printed circuit board (PCB). In this example, the memory buffer IC 240 is shown schematically in FIG. 2 in a single block, but it can also be provided in separate functional blocks, which can be included in a single assembly.

In another exemplary embodiment, the memory buffer IC 240 includes a PMIC module to convert a supply voltage to one or more output voltages (e.g., VDD, VDDQ, VPP, VSSQ, etc.) for use by the memory device 250. In this regard, the output voltage generated by the PMIC module of the memory buffer IC 240 can have a different voltage level (e.g., 1.1V, 1.3V, 1.5V, etc.) than that of the supply voltage (e.g., 3.3V, 5V, 12V, etc.) with a different tolerance (e.g., ±1%, ±3%, ±5%, etc.) than that of the supply voltage (e.g., ±5%, ±10%, etc.). Further, the memory buffer IC 240 can also operate the PMIC module to further supply output voltage to an output contact edge connector of a packaged memory module 220 to enable the memory module 220 to provide converted and/or regulated output voltage to one or more device external to the memory module 220 (e.g., another memory module without a PMIC module, a processor, a chipset, another logic circuit, an expansion card, etc.).

Figure 3:
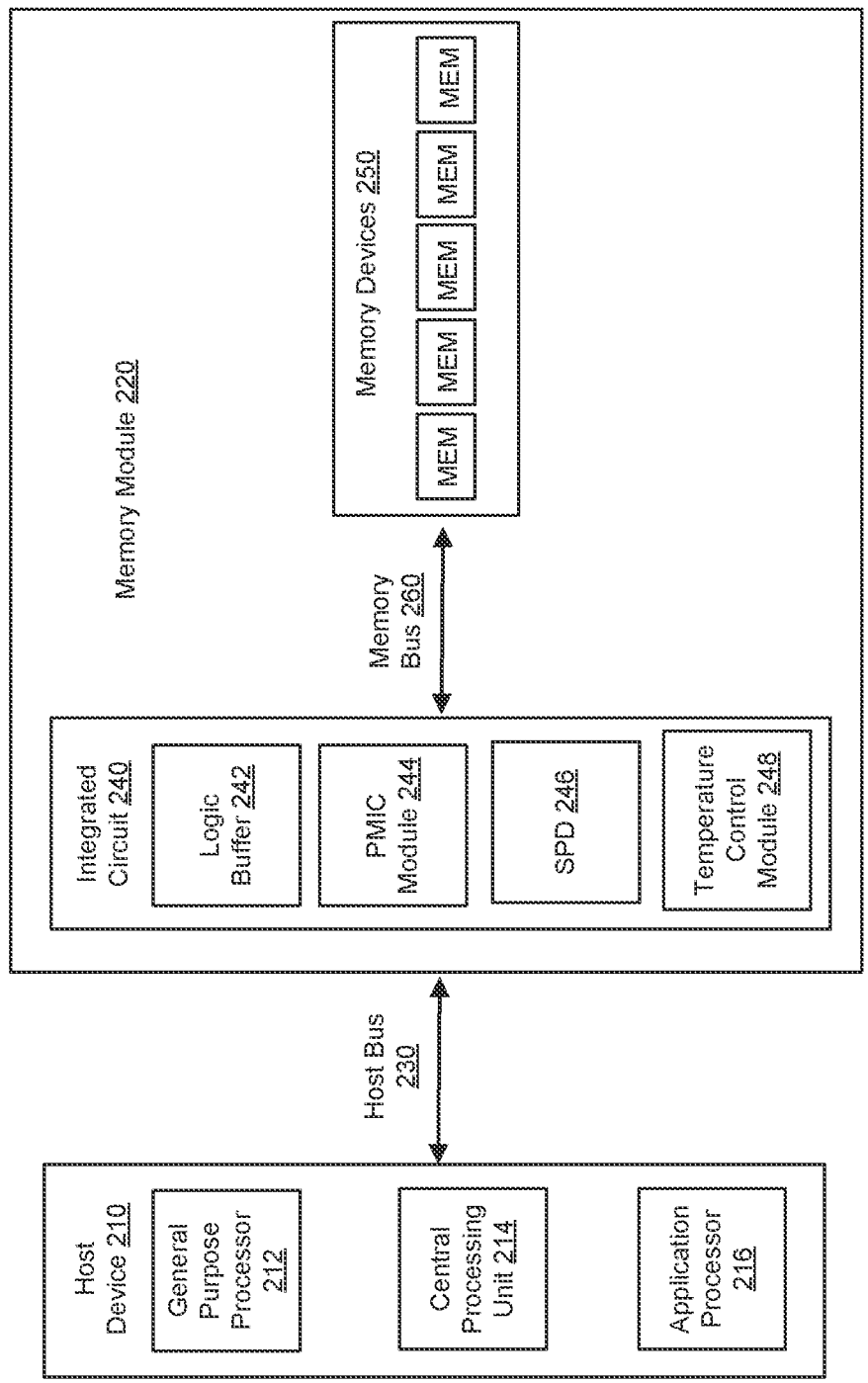
FIG. 3 depicts a detailed block diagram schematically illustrating the memory module shown in FIG. 2.

FIG. 3 depicts a detailed block diagram of the memory module illustrated in FIG. 2. In this example, the memory devices 250 can each include an array of memory cells, including volatile and/or non-volatile cells. In one embodiment, the memory devices 250 and the memory buffer IC 240 are each provided as separate semiconductor chips (e.g., separately connected to the memory module 220).

In one embodiment, the host device 210 may include one or more processors, such as a general-purpose processor 212, a central processing unit (CPU) 214, or an application processor 216, which are coupled to the memory module 220 by the host bus 230. The host bus 230 receives command or address signals, clock signals, power signals, and data signals from, and transmits data signals to one or more of the processors during memory access operations (e.g., reads and writes). In one embodiment, the one or more processors may be connected directly to the memory buffer IC 240 of the memory module 220 for signals transitions. In other embodiments, the one or more of the processors may be indirectly connected to the memory buffer IC 240 (e.g., over a networked connection or through intermediate devices).

In one embodiment, the memory devices 250 can include a double data rate (DDR) SDRAM with two independent subchannels, e.g., when the memory module 220 is a dual in-line memory module (DIMM). Each subchannel of the memory devices 250 can have up to two or more physical memory package ranks. Each of the two memory package ranks can be configured in a primary/secondary topology to enable additional logical ranks for increased memory density. Here, the local voltage regulation of the memory device 250 is performed by the PMIC module 244 provided in the memory buffer IC 240 through the memory bus 260.

In one embodiment, the memory buffer IC 240 includes a logic buffer 242 that is connected to the host device 210 through the host bus 230 and that is coupled to the memory devices 250 through the memory bus 260. The logic buffer 242 may receive command and/or address signals and data signals via the host bus 230 and transmit the signals to the memory devices 250 to perform memory operations. The memory devices 250 can also return data signals, such as read data or write confirmation information to the host device 210 via the logic buffer 242. In one embodiment, the logic buffer 242 is configured to receive signals from the host that are encoded according to a first communication protocol, and to convert/encode the signals according to a second communication protocol before providing them to the memory devices 250, and vice versa. The communication protocols may be associated with a particular type of memory device, such as DDR5, LPDDR5, SERDES, etc. In some embodiments, the signal sent to the memory devices 250 may be a multilevel signal. For example, two bits encoded as a single voltage level corresponding to a logical state of the two bits (e.g., logic 00, 01, 10, or 11 etc.). Other types of multilevel signals may also be used. Through translating the signals received on one bus before transmitting them on the other, the logic buffer 242 enables the host device 210 to communicate with the memory devices 250 using various communication protocols. In some other embodiments, the logic buffer 242 could enable a first-in, first-out (FIFO) buffering, by which the order in which the data enters the memory buffer IC 240 and transits out to the memory device 250 is maintained in a same sequence. In other embodiments, the logic buffer 242 could enable an out-of-order buffering or an opposite-order buffering, e.g., a last-in, first-out (LIFO) buffering, by which the received data from the host device 210 is transmitted to the memory devices 250 in the opposite order than that in which it was received by the memory buffer IC 240.

In one embodiment, the memory buffer IC 240 may also include a PMIC module 244. According to one embodiment of the subject technology, the PMIC module 244 can include one or more registers for storing information of output voltage to the operably connected memory device 250. For example, the PMIC registers may include information corresponding to the voltage levels of the output voltages, tolerances of the output voltages, and order in which the output voltages are powered up and/or powered down, delays between powering up/down the output voltages, etc. In some embodiments, the PMIC module 244 can be configured to output information or a portion thereof in response to a command received by the memory module 220 from the connected host device 210. For example, the application processor 216 of the host device 210 can issue a command signal to the memory module 220 to cause a changed output voltage level for the memory devices 250. In response, the PMIC module 244 combined in the memory buffer IC 240 can modify its voltage level in accordance with the modified information in its PMIC registers and transmits the modified output voltage to the memory device 250 through the memory bus 260. In one embodiment, the PMIC module 244 can be configured to perform smart voltage regulation on the memory device 250. For example, the PMIC module 244 can provide power signals to the memory arrays of the memory devices 250 to enable configurability of voltage ramps and levels as well as current monitoring. Here, the power management on memory device 250 can be performed from a remote chip, i.e., the memory buffer IC 240, to allow additional power management functions like threshold protection, error injection capabilities, and programmable power on sequence, etc. The presence of the PMIC module 244 on a separate memory buffer chip (e.g., the memory buffer IC 240) enables better power regulation and reduces complexity of the memory device design by reducing a scope of DRAM power delivery network management.

In one embodiment, the PMIC module 244 could enable a dynamic supply voltage scaling on the memory devices 250. Since the PMIC module 244 can be integrated on the memory buffer IC 240 with a logic buffer which monitors status of the coupled memory devices 250, it can be configured to reduce or increase the supply voltage to the memory devices 250 when it is safe.

In one embodiment, the memory buffer IC 240 may include a serial presence detect (SPD) hub 246. The SPD hub 246 can perform as a secondary to the memory device system host sideband and act as a primary to the remaining active components. The SPD hub 246 may contain programmable read-only memory (PROM) pertaining to the SPD. In one embodiment, the SPD hub 246 interacts with the host device 210 via the host bus 230, and decouples the load transmitted from the host device 210 to the memory devices 250, while providing local access to remaining components of the memory buffer IC 240 including the logic buffer 242, PMIC module 244, and a temperature sensor module 248. In this example, features of the SPD hub 246 allows an isolation of internal memory buses within memory devices 250 from the host bus 230.

In one embodiment, the memory buffer IC 240 may include a temperature control module 248 configured to sense local temperatures on the memory devices 250. For example, one or more temperature sensors can be embedded in the memory banks of the memory devices 250 to monitor thermal changes across the length of each memory subchannel. Particularly, each temperature sensor can be placed strategically near each end of the memory banks (e.g., corresponding to DIMM subchannels). Here, the temperature sensor module 248 may be connected with the temperature sensors via a I2C/I3C bus that is incorporated in the memory bus 260. The temperature control module 248 communicates with the embedded temperature sensor to monitor temperature update flags from each DRAM die of the memory package banks until a temperature threshold is approaching. The temperature control module 248 may be an analog device or a mixed-signal device for receiving temperature control signals from or outputting the memory device temperature information to the host device 210.

In another embodiment, the memory buffer IC 240 may include a temperature control module 248 that configured for module-level or logic-level temperature monitoring. For example, one or more temperature sensors can be embedded on the memory module 220, e.g., on the memory buffer IC 240 or on one of the memory devices 250. The temperature control module 248 may be connected with the embedded one or more temperature sensors to monitor the temperature of the memory module 220. In another embodiment, the one or more temperature sensors may be disposed within the temperature control module 248 for the module-level temperature monitoring.

In some embodiments, the memory buffer IC 240 may also include security logic modules, e.g., enhanced SPD functions with logic for memory module authentication. In other embodiments, the memory buffer IC 240 may include a secure buffer ASIC module to provide privacy guarantees for data and computation in the memory module 220. For example, RAM controller functionality can be shifted from a secure CPU to the secure buffer module of the memory buffer IC 240. This way, a CPU vendor can design its own trusted buffer memory chip and secure the memory devices 250 while using non-trusted commodity DRAM chips.

In some embodiments, various components of the memory buffer IC 240 including the logic buffer 242, the PMIC module 244, the SPD hub 246, and the temperature sensor module 248, can all be fabricated by a conventional semiconductor process, e.g., a fin field-effect transistor (FinFET) process and integrated on a same memory buffer chip. Components of the memory buffer IC 240 can also be fabricated on separated semiconductor dice and packaged into an individual memory buffer assembly.

Figure 4:
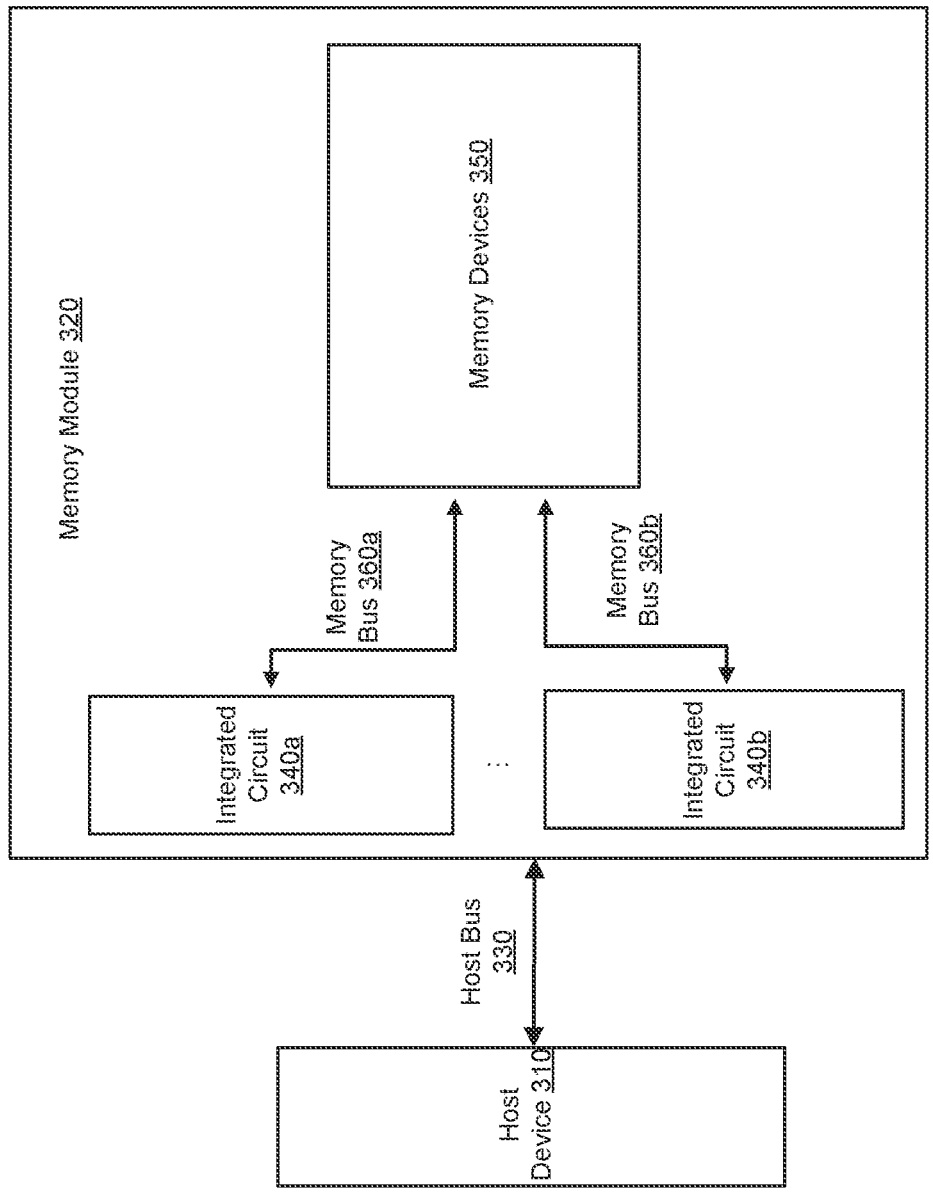
FIG. 4 is a simplified block diagram schematically illustrating another memory module in accordance with another embodiment of the present technology.

Turning to FIG. 4, a simplified block diagram schematically illustrating another memory module 320 in accordance with another embodiment of the present technology. In this example, the memory module 320 is coupled with a host device 310 through a host bus 330. The memory module 320 includes a plurality of memory devices 350 designated as multiple channels. In addition, the memory module 320 includes a plurality of memory buffer integrated circuits (ICs) 340 including memory buffer IC 340a and memory buffer IC 340b. The memory buffer ICs 340a and 340b are configured to transmit signals including command signals, address signals, power signals, clock signals and data signals between the host device 310 and the plurality of memory devices 350 through the host bus 330 and a plurality of memory buses including memory bus 360a and memory bus 360b. This memory architecture enables memory buffer and logic functions to be done on a memory channel basis, i.e., one of the memory buffer ICs being coupled to one of the multiple memory channels.

In one embodiment, the host device 310 perform memory operations such as memory read and write on a different channel of the memory channels populated by a different set of memory devices 350. Specifically, the memory channel operation can be conducted through one of the memory buffer ICs 340. For example, the memory buffer IC 340a receives command/address signals that are dedicated to a first memory module channel and transmits the signals to the memory devices 350 of the first memory module channel. On the other hand, the memory buffer IC 340a reads data from the memory devices 350 of the first memory channel and transmits the data signal to the host device 310. In this example, the memory buffer IC 340a is coupled with the first memory channel by the memory bus 360a. Similarly, the memory buffer IC 340b can be configured to receive command/address signals from the host device 310 and data signals from memory devices 350 of a second memory channel, and to transmit the command/address signals and the data signals to the memory devices 350 of the second memory channel and the host device 310, respectively. In this example, the number of memory buffer chips are equal to or more than the number of memory channels of the memory module 320. This way, at least one memory buffer chip can be designated for buffering data signals and logic control signals between the host device 310 and one memory channel.

In one embodiment, the memory module 320 enables memory device power savings by enabling the PMIC functions on a per-memory channel basis. For example, multiple PMIC modules included in the memory buffer ICs 340a and 340b can be dedicated/coupled to memory channels of the memory module 320, so as to reduce power supply voltage to one of the memory channels while maintaining a higher supply voltage to other memory channels of the memory module 320. The memory architecture shown in FIG. 4, specifically migrating the PMIC modules to the plurality of memory buffer ICs, independently manages power supply on each of the memory channels according to each of the memory channels' operations.

Figure 5:
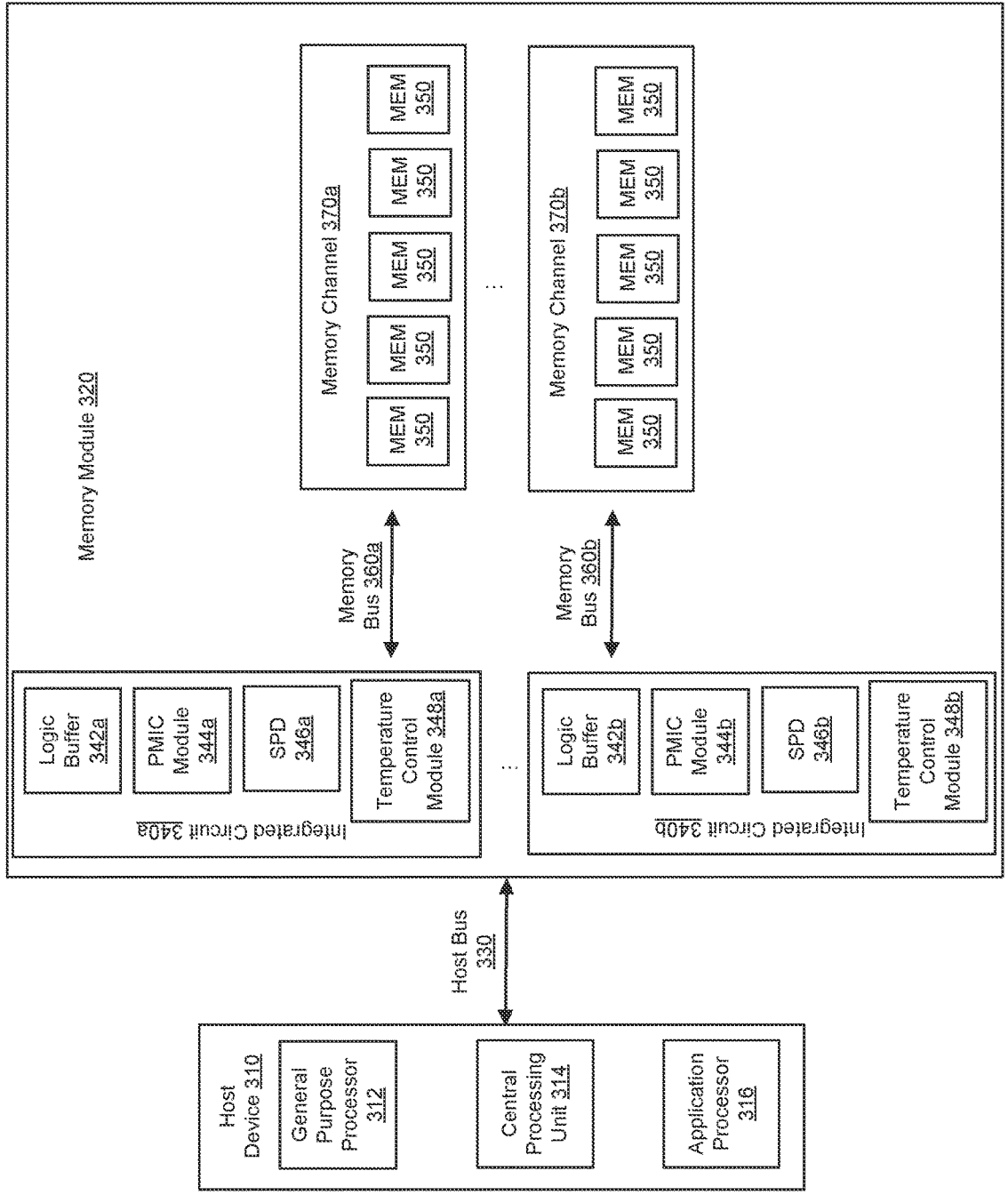
FIG. 5 depicts a detailed block diagram schematically illustrating the memory module shown in FIG. 4.

FIG. 5 depicts a detail block diagram of the memory module 320 illustrated in FIG. 4. In this example, the memory module 320 includes a plurality of memory buffer ICs 340, each of the memory buffer ICs 340 being dedicated to a memory channel of the memory module 320 for memory buffering and logic controls.

In one embodiment, the host device 310 may include one or more processors, such as a general-purpose processor 312, a central processing unit 314, or an application processor 316, which are coupled to the memory module 320 by the host bus 330. The host bus 330 receives command or address signals, clock signal, power signal, and data signals from, and transmits data signals to one or more of the processors during memory access operations (e.g., reads and writes). In one embodiment, the one or more processors may be connected directly to the memory buffer ICs of the memory module 320 for signals transition. In other embodiments, the one or more of the processors may be indirectly connected to the memory module 320 (e.g., over a networked connection or through intermediate devices).

In one embodiment, the memory module 320 may include multiple ranks/independent channels of memory devices 350, e.g., the memory channel 370a and memory channel 370b. Each channel of the memory module 320 may be configured to include a plurality of memory devices. For example, each of the memory channels 370a and 370b includes five memory devices 350. Here, each memory channel can be configured to include four memory devices that are dedicated for storing user data, with a fifth memory device that is dedicated for storing metadata about the user data for error detection and/or correction. Alternatively, all five memory devices 350 of each of the memory channels can be similarly configured to operate with multiple pseudo-channels, such that all of the memory devices 250 being configured to store metadata.

In one embodiment, the memory module 320 includes a plurality of memory buffer ICs. For example, memory buffer IC 340a and 340b are included in the memory module 320 and are coupled to the memory channels 370a and 370b through the memory bus 360a and 360b, respectively. In particular, each of the memory buffer ICs 340 is coupled to a different memory channel of the memory module 320 populated by a different set of memory devices 350. For example, the memory buffer IC 340a is coupled to the memory channel 370a, buffering signals and providing logic controls to the five memory devices 350 of the memory channel 370a. Similarly, the memory buffer IC 340b is couple to the memory channel 370b, buffering signals and providing logic controls to the five memory devices 350 of the memory channel 370b.

In one embodiment, each of the plurality of memory buffer ICs is an individually packaged chip that combines various functional modules including a logic buffer, a PMIC module, a SPD hub, and a temperature control module. For example, the memory buffer IC 340a includes a logic buffer module 342a configured to transmit command/address signals received from the host device 310 to the memory subchannel 350a of the memory device 350. In turn, the logic buffer 342a transmits data signals from the memory channel 370a to the host device 310. In this example, the memory buffer IC 340a also include a PMIC module 344b that is configured for voltage regulation on the memory device of memory channel 370a. Specifically, the PMIC module 344b may perform a specific voltage control on the memory devices of memory channel 370a that are different to other memory devices of the memory module 320. Further, the memory buffer IC 340a may include a SPD hub 246a that is dedicated to the operation of memory channel 370a and that provides local access to remaining components of the memory buffer IC 340A such as the logic buffer 342a, the PMIC module 344a, and temperature control module 348a. In this example, the memory buffer IC 340a may include a temperature control module 348a configured to sense local temperature of the memory devices in the memory channels. One or more temperature sensors may be embedded in the memory channels of the memory module 320 to detect thermal changes across the length of the memory channel. The temperature control module 348a communicates with the one or more temperature sensors via the memory bus 360a to update flags from each memory device 350 of the memory channel 370a until a temperature threshold is approaching. In another embodiment, the temperature control module 348a may be configured to monitor module-level or logic-level temperature by embedding one or more temperature sensors on the memory module 220, e.g., on the memory buffer IC 340a.

In one embodiment and similar to the memory buffer IC 340a, the memory buffer IC 340b includes a logic buffer 342b, a PMIC module 344b, a SPD hub 346b, and a temperature sensor module 348b that are configured to transmit data signals and logic control signals between the host device 310 and memory devices 350 of the memory channel 370b. The transition of data signals and control signals there between is conducted through the memory bus 360b.

In one embodiment, each component of the memory buffer ICs 340 are fabricated by a conventional semiconductor process, e.g., a FinFET process that the memory buffer IC components can be fabricated on a same die and packaged into an individual memory buffer assembly. In this example, the memory buffer ICs 340a and 340b, as well as the memory channels can be incorporated on a PCB to form the memory module 320.

It should be noted that the methods described above describe possible implementations, and that the operations and the steps may be rearranged or otherwise modified and that other implementations are possible. Furthermore, embodiments from two or more of the methods may be combined.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "over," "up," "down," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
   a plurality of memories; and
   a single integrated circuit (IC) that is configured to be coupled to a host device by a host bus and that is coupled to the plurality of memories by a memory bus, wherein the IC comprises:
      a logic buffer module that is configured to buffer data signals, command signals, address signals, and clock signals between the host device and the plurality of memories and to monitor a status of the plurality of memories, and
      a power management integrated circuit (PMIC) module that is coupled with the logic buffer module, wherein the PMIC is configured, based on the monitored status of the plurality of memories, to enable a dynamic supply voltage scaling for the plurality of memories.

2. The apparatus of claim 1, wherein the plurality of memories comprises double data rate synchronous dynamic random-access memories.

3. The apparatus of claim 1, wherein the PMIC module is further configured to enable threshold voltage protection, programmable power on sequence, or power management to the plurality of memories.

4. The apparatus of claim 1, wherein the PMIC module is further configured to regulate voltage and monitor current provided to the plurality of memories.

5. The apparatus of claim 1, wherein the single IC further comprises a serial presence detect (SPD) hub that is configured to control plane communication between components of the IC and the host device, and to decouple load from the host device to the plurality of memories.

6. The apparatus of claim 1, wherein the single IC further comprises a temperature control module.

7. The apparatus of claim 1, wherein the single IC further comprises a security logic module.

8. The apparatus of claim 1, wherein the single IC is configured to support multi-level signaling between the host device and the plurality of memories.

9. The apparatus of claim 1, wherein the single IC is configured to support various buffering operations including Fist-In-First-Out (FIFO), Last-In-First-Out (LIFO), or out-of-order execution.

10. The apparatus of claim 1, wherein the logic buffer of the single IC permits configurability of memory bus width and clock speed.

11. A memory system, comprising:
    a host device;
    a memory module including:
       a first plurality of memory devices, and
       a first single integrated circuit (IC) coupled to the first plurality of memory devices by a first memory bus, wherein the first single IC comprises:
          a first logic buffer module that is configured to buffer data signals, command signals, address signals, and clock signals between the host device and the first plurality of memory devices and to monitor a status of the first plurality of memories, and
          a first power management integrated circuit (PMIC) module that is coupled with the first logic buffer module, wherein the first PMIC is configured, based on the monitored status of the first plurality of memory devices, to enable a first dynamic supply voltage scaling for the first plurality of memory devices; and
    a host bus that is configured to couple the host device and the memory module.

12. The memory system of claim 11, wherein the memory module further comprises:
    a second plurality of memory devices, and
    a second single IC coupled to the second plurality of memory devices by a second memory bus, wherein the second single IC comprises:
       a second logic buffer module that is configured to buffer data signals, command signals, address signals, and clock signals between the host device and the second plurality of memory devices and to monitor a status of the second plurality of memories, and
       a second PMIC module that is coupled with the second logic buffer module, wherein the second PMIC is configured, based on the monitored status of the second plurality of memory devices, to enable a second dynamic supply voltage scaling for the second plurality of memory devices.

13. The memory system of claim 12, wherein each of the first and second single ICs further comprises a temperature control module.

14. The memory system of claim 12, wherein each of the first and second single ICs further comprises a serial presence detect (SPD) hub that is configured to control plane communication between components of the IC and the host device, and to decouple load from the host device to the memory module.

15. The memory system of claim 12, wherein each of the first and second single ICs further comprises a security logic module.

16. The memory system of claim 12, wherein the PMIC module of each of the first and second single ICs is configured to enable threshold voltage protection, programmable power on sequence, or power management to the first and second plurality of memory devices, respectively.

17. The memory system of claim 11, wherein the memory module comprises double data rate synchronous dynamic random-access memories.

18. An integrated circuit (IC), comprising:
    a logic buffer module that is configured to buffer data signals, command signals, address signals, and clock signals between a host device and one or more corresponding memory channels of a memory module and to monitor a status of the memory module;
    a power management integrated circuit (PMIC) module that is coupled with the logic buffer module, wherein the PMIC is configured, based on the monitored status of the memory module, to enable a dynamic supply voltage scaling for the memory module;
    memory bus terminals that are configured to be coupled to the one or more memory channels; and
    host bus terminals that are configured to be coupled to the host device.

19. The integrated circuit of claim 18, further comprises a serial presence detect (SPD) hub that is configured to control plane communication between components of the IC and the host device, and to decouple load from the host device to the corresponding one or more memory channels of the memory module.

20. The integrated circuit of claim 18, further comprising a temperature control module and a security logic module.

* * * * *